United States Patent [19]

Hayashi et al.

[11] Patent Number: 5,014,020

[45] Date of Patent: May 7, 1991

[54] AMPLIFIER FOR OUTPUTTING MOTOR CONTROLLING SIGNAL IN MOTOR CONTROLLING CIRCUIT

[75] Inventors: Michihiko Hayashi; Kenzi Ohtani, both of Kyoto, Japan

[73] Assignee: Rohm Co., Ltd., Kyoto, Japan

[21] Appl. No.: 448,953

[22] Filed: Dec. 12, 1989

[30] Foreign Application Priority Data

Dec. 20, 1988 [JP] Japan .......................... 63-165523[U]

[51] Int. Cl.$^5$ .............................................. H03F 3/45
[52] U.S. Cl. ...................................... 330/257; 330/288
[58] Field of Search ........................... 318/53, 66, 254; 323/315, 316; 330/252, 254, 257, 288

[56] References Cited

U.S. PATENT DOCUMENTS

| | | | |
|---|---|---|---|
| 4,654,602 | 3/1987 | Aoki | 330/257 |
| 4,658,190 | 4/1987 | Miyazaki et al. | 318/254 |
| 4,804,892 | 2/1989 | Müller | 318/254 |

*Primary Examiner*—Steven Mottola
*Attorney, Agent, or Firm*—Oliff & Berridge

[57] ABSTRACT

A motor controlling circuit used for controlling the drive of a motor, and particularly to improvements of the control characteristics of the amplifier. A current setting transistor for setting an amount of current flowing from a differential amplifier to a predetermined value is disposed on the downstream side of the differential amplifier. The amount of current flowing across this current setting transistor is varied in response to the level of an input signal to the amplifier, so that the current outputting capability of the differential amplifier is proportional to the level of the input signal. Accordingly, when the level of the input signal is small, the gain of the amplifier is made small, and a gain for an amount of ripple at that time is also made small. Hence, it is possible to control an adverse effect of the ripple carried on the input signal when the level of the input signal is small. In addition, it is possible to eliminate an output current when the level of the input signal is zero, thereby controlling the generation of an error current due to an offset.

4 Claims, 4 Drawing Sheets

AMPLIFIER FOR OUTPUTTING MOTOR CONTROLLING SIGNAL IN MOTOR CONTROLLING CIRCUIT

BACKGROUND OF THE INVENTION

1. Field of the Invention

The present invention relates to an amplifier in a motor controlling circuit used for controlling the drive of a motor, and more particularly to improvements of its control characteristics.

2. Description of the Related Art

Hitherto, electric motors have been used extensively as driving sources for various equipments. In particular, since the numbers of revolutions of motors can be controlled through the supply of electric power thereto, motors have been used extensively as driving sources for controlling the rotating speed of various equipments.

In the control of such a motor, it has been the practice to detect the number of revolutions of the motor and change a drive current in correspondence with the number of revolutions detected. For instance, in the control of a DC servo motor, as shown in FIG. 2, the number of revolutions of a motor 100 is detected by an FG coil (frequency generating coil) 102, and a supply current to the motor 100 is controlled in response to that revolution detection signal. Namely, the revolution detection signal obtained by the FG coil 102 is first supplied to a revolution control unit 104. In response to the revolution detection signal inputted, the revolution control unit 104 outputs a voltage signal concerning a current to be supplied to the motor 100. Then, this voltage signal is converted into a torque signal of a current signal by a voltage/current converter 106 so as to be supplied to an amplifier 108.

The error amplifier 108 amplifies the torque signal thus inputted and supplies the same to a motor driver 112 via a current feedback amplifier 110. Since the motor driver 112 controls a supply current to the motor 100 in response to the signal inputted thereto, the motor driver 112 is capable of supplying predetermined power to the motor 100, thereby making it possible to drive the motor 100 at a desired speed of rotation.

In addition, the arrangement is such that a capacitor $C_0$ for phase compensation is connected to the current feedback amplifier 110, and a signal concerning the supply current to the motor 100 which is obtained by the current detector 114 is supplied to the current feedback amplifier 110. Consequently, the current feedback amplifier 110 is capable of effecting feedback control of the supply current to the motor 100. It should be noted that in the present specification the amplifier 108 with the current feedback amplifier 110 will be referred to as an error amplifier 10.

Referring now to FIG. 3, a description will be given of an example of such a conventional error amplifier.

The error amplifier 10 receives an input signal T for controlling a drive current value, and outputs an output current I corresponding thereto.

The input signal T is inputted to an input voltage regulator 12 having one terminal connected to a power source. In response to this input signal the input current regulator 12 controls the current flowing therethrough. In addition, a current mirror 14 consisting of a pair of transistors 14a, 14b is disposed on the downstream side of the input current regulator 12. In consequence, the same current as that for the current regulator 12 also flows across a resistor 16 having one terminal connected to the output side of the current mirror 14 and the other terminal connected to the power source. Accordingly, the potential on the downstream side of the resistor 16 corresponds to the input signal.

Furthermore, the downstream-side terminal of this resistor 16 is connected to the base of a differential amplification input-side transistor 18a. The emitter of the transistor 18a is connected to a differential amplification output-side transistor 18b, and is connected to ground via a constant current source 20. It should be noted that a variable power source 22 whose power varies in correspondence with a detected value of an output current from an output current detection unit (not illustrated) is connected to the base of the differential amplification output-side transistor 18b, so that current feedback is effected for this transistor 18b in such a manner that its current value becomes identical with that of the detection unit. In addition, the collectors of the transistors 18a, 18b are connected to the power source via a pair of transistors 24a, 24b connected so as to constitute a current mirror.

Accordingly, the amount of current flowing across the transistor 18a varies as the base potential of the transistor 18a varies, and the current flowing across the transistors 24a, 24b constituting the current mirror varies as a result.

In addition, a point of connection between the collectors of the transistor 24b and the transistor 18b is connected to the common base of a pair of transistors 26a, 26b constituting a current mirror for output as well as the collector of the transistor 26a. Consequently, the amount of current flowing across the transistor 26a, i.e., the output current I, varies in correspondence with the amount of current flowing to the point of contact between the collectors of the transistor 24b and the transistor 18b.

As described above, the error amplifier 10 outputs the output current I which varies in correspondence with variations in the output signal. A voltage drop in the transistor 18a is caused by dynamic resistance alone, and this amount of current is determined by a voltage drop in the resistor 16, so that if the resistance value of the resistor 16, the value of the constant current source 20, etc., are selected at appropriate levels, it is possible to obtain a predetermined current gain with respect to an input signal.

However, in the conventional motor controlling circuit having the above-described error amplifier, there has been a problem in that a ripple is contained in a control signal which is outputted, with the result that the ripple can leak to the motor driving current, thereby exerting an adverse effect to the output torque of the motor.

In addition, although it is ideal that the error amplifier 10 should essentially not output a current when a control signal is not inputted thereto, there have been cases where an output current is generated even when there is no control signal inputted thereto, due to an input offset or the like of the error amplifier 10 in the conventional circuit. Accordingly, it has conventionally been necessary, among other measures, to design the circuit by setting a negative offset such that an output current will be generated only when the level of the control signal inputted is high.

Furthermore, the input signal inputted to the error amplifier 10 is, in many cases, formed by integrating pulse width modulation (PWM) waves on the bases of a result obtained by comparing a detected value of the number of revolutions of the motor and a set value. In such a case, the effect of the PWM waves remains in the input signal, and a ripple is contained in the output current. In other cases as well, a detected value and the like of the number of revolutions is basically an output of digital pulses, and arithmetic processing is carried out by using digital data. Accordingly, if digital data is converted to an analog voltage or the like, a ripple is frequently contained in the output current.

In the case of the above-described conventional example, a current gain in the error amplifier 10 is a fixed value determined by a setting for the circuit. Accordingly, the amplification of the same factor can be carried out irrespective of the level of the input signal. For instance, if the current gain is 20-fold, and a ripple width (the width between a maximum and a minimum value of a ripple) in a current (input current) in the input current regulator 12 is 0.1 $\mu A$ irrespective of the level of the input current, the width of the ripple carried on the output current becomes $2\mu A$ irrespective of the level of the output current I. It should be noted that the width of the ripple carried on the input current depends on a voltage at the time when the pulse of digital data is at high level, so that the ripple width in many cases does not depend on the level of the input signal. Accordingly, the smaller the input current, i.e., the smaller the output current I, the greater a ripple ratio (ratio of the relative size of the ripple width with respect to an output level).

In addition, a ratio between an output current and an input current in the error amplifier 10 in FIG. 2 should become constant irrespective of the current conversion gain since current feedback is provided for a current feedback amplifier 110. However, there has been another drawback in that since the capacitor $C_0$ for phase compensation connected to the current feedback amplifier 110 serves as an integration circuit, if the conversion gain is large at the time of its transient fluctuations, the amount of ripple remaining becomes large correspondingly.

SUMMARY OF THE INVENTION

Accordingly, an object of the present invention is to provide a motor controlling circuit which is capable of effectively controlling the effect of a ripple contained in an output signal on a motor and of preventing a malfunctioning due to an offset, i.e, of suppressing an output, at the time when a control input is not present.

To this end, in accordance with the present invention, there is provided an amplifier for outputting a DC motor controlling signal in a motor controlling circuit, comprising: a current regulator for varying an amount of current flowing across the current regulator, in response to an input signal; and means for changing the current outputting capability of the amplifier in correspondence with the amount of current flowing across the current regulator, wherein the current outputting capability is changed in such a manner as to become small when the level of the input signal is small and become large when the level of the input signal is large.

In accordance with the present invention, when a motor controlling signal for controlling the torque of a motor is small, the gain of the error amplifier becomes small. Consequently, an amplification factor concerning the amount of ripple carried on an input signal becomes small, so that it is possible to control the adverse effect exerted on a motor output to a low level. In addition, when there is no input signal, the error amplifier does not function, so that an erroneous output is not generated.

The above and other objects, features and advantages of the present invention will become more apparent from the following detailed description of the invention when taken in conjunction with the accompanying drawings.

DESCRIPTION OF THE PREFERRED EMBODIMENT

Referring now to the accompanying drawings, a description will be given of an embodiment of a motor controlling circuit in accordance with the present invention.

Figure 1:
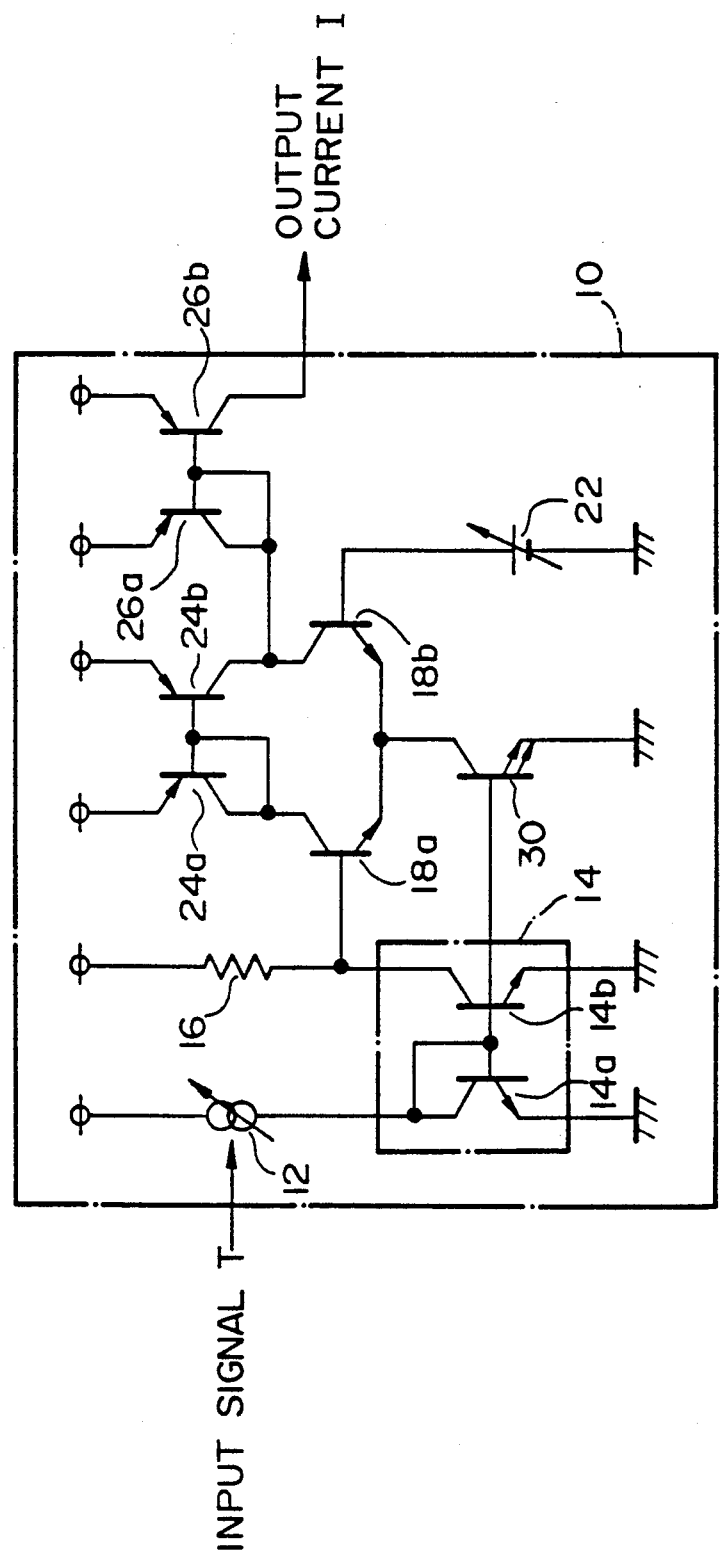
FIG. 1 is a circuit diagram illustrating an embodiment of an error amplifier suitable for a motor controlling circuit in accordance with the present invention.
Figure 2:
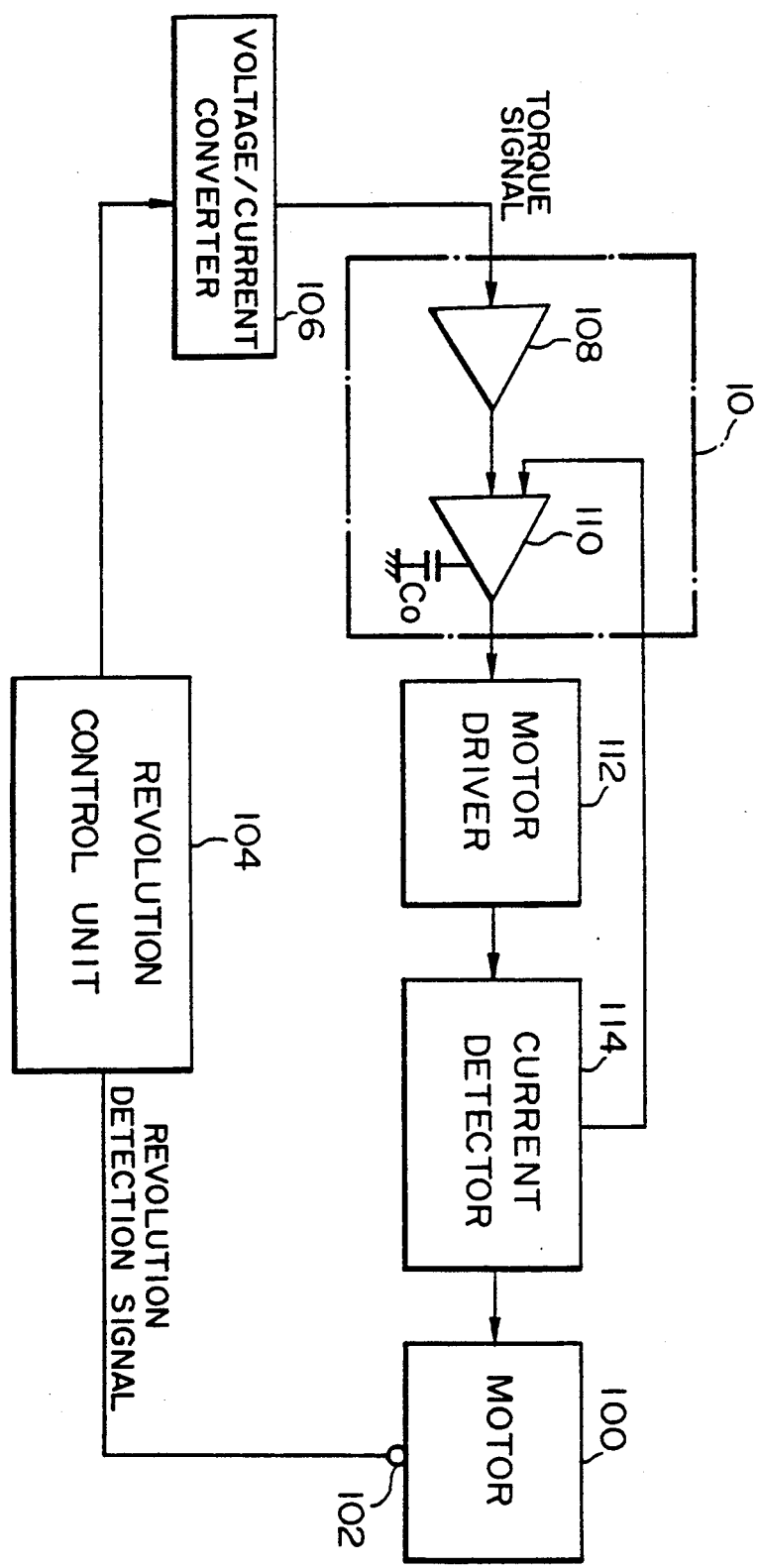
FIG. 2 is a block diagram illustrating a system to which the motor controlling circuit is applied.
Figure 3:
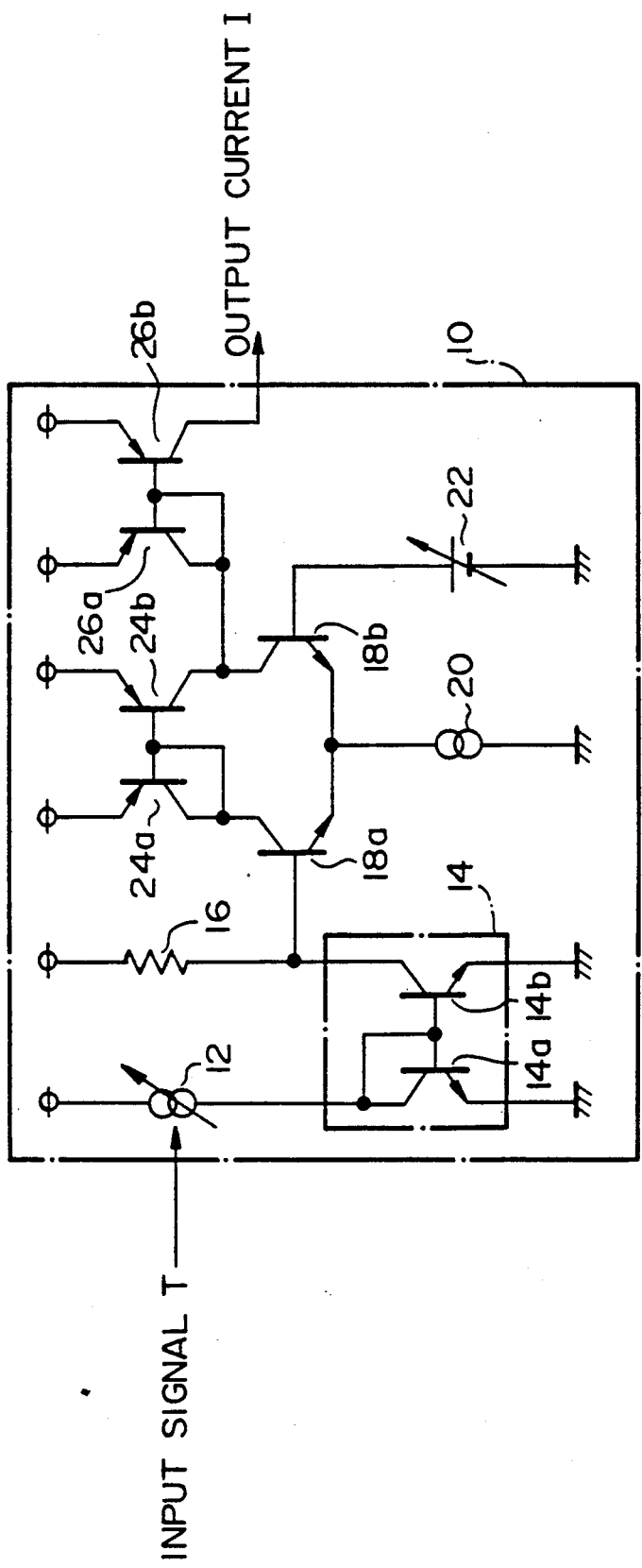
FIG. 3 is a circuit diagram illustrating an example of a conventional error amplifier.
Figure 4:
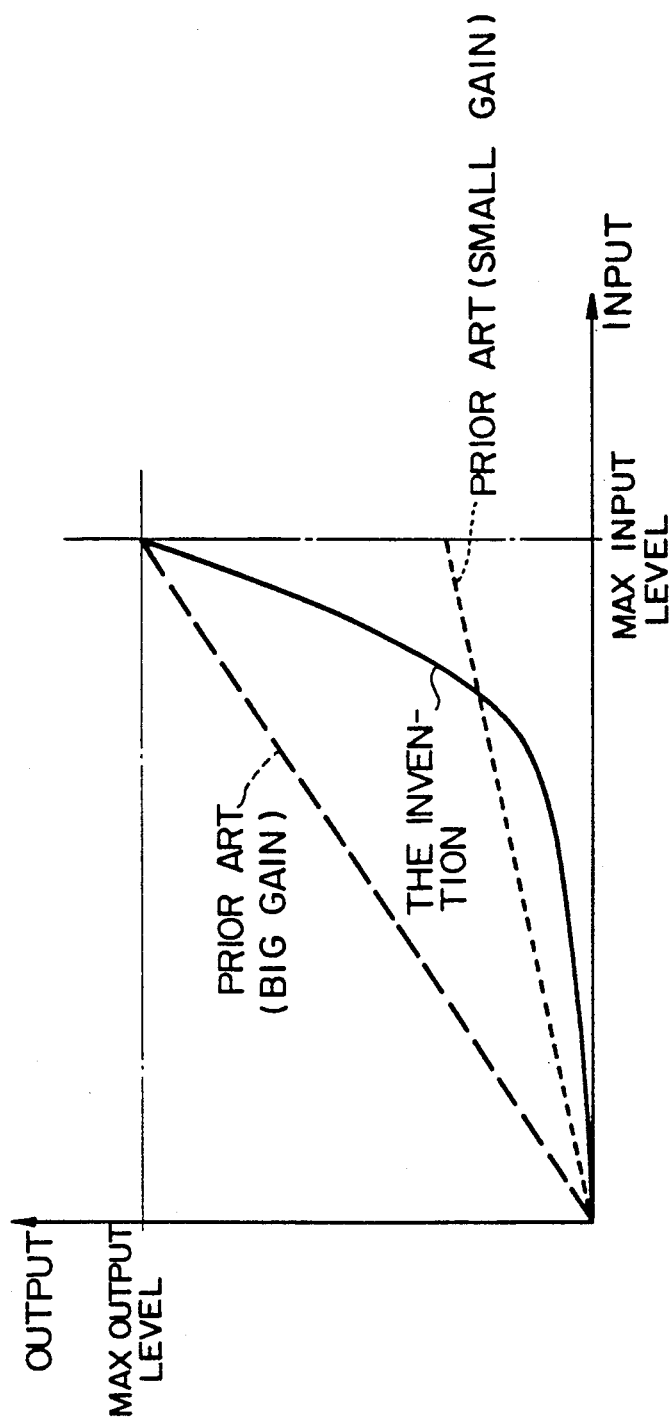
FIG. 4 is a characteristic diagram illustrating input characteristics of the error amplifier.

FIG. 1 illustrates a configuration of an error amplifier 10 suitable for a motor controlling circuit in accordance with the present invention. It should be noted that components that are identical with those of the prior art are denoted by the same reference numberals, and a description thereof will be omitted.

A characteristic feature of this embodiment is that a current regulating transistor 30 is provided instead of the constant current source 20 of the prior art. The base of this current regulating transistor 30 is connected to the bases of a pair of transistors 14a, 14b constituting a current mirror 14.

Accordingly, the amount of current flowing across this current regulating transistor 30 becomes proportional to the current flowing across the current mirror, i.e., an input signal. Hence, both the current flowing across a transistor 18a and the current flowing across the current regulating transistor 30 become proportional to the input signal. Consequently, the current gain of the error amplifier 10 becomes proportional to the input current, while the output current I becomes proportional to a square of the input current.

Accordingly, as for the relationship between the level of the input signal and that of the output signal, the level of the output signal is low when the input signal is small, while the level of the output signal is high when the input signal is large. At this juncture, in the case of the error amplifier 10 of this embodiment, when the level of the input signal is small, in order to obtain an identical output to that of the prior art, it is necessary for the level of the input signal to become large by that margin.

Namely, assuming that the current gain in the prior art is 20-fold, in a case where the input current is 1 $\mu A$ the output current I is 20 $\mu A$. If the width of the ripple contained in the input current is assumed to be 0.1 $\mu A$, the width of the ripple contained in the output current I Becomes 2 $\mu A$. In contrast, in accordance with the error amplifier 10 of this embodiment, when the input current is 3.16 $\mu A$, the output current becomes 20 $\mu A$, the ripple width being 0.63 $\mu A$ or thereabouts. Accordingly, the ripple ratio during normal use can be controlled to a very low level as compared with the prior art. For this reason, it is possible to control variations in the motor torque attributable to the ripple.

Furthermore when the level of the input signal is large, the current gain increases correspondingly, and the maximum output of the error amplifier 10 can be held in the same way as the prior art. Accordingly, it is possible to obtain adequate response characteristics at the time of a maximum acceleration such as when the motor is driven.

Meanwhile, when there is no input signal, since no current flows across the transistor 30, the differential amplification circuit constituted by the transistors 18a, 18b is neither operated. Hence, even when there is an offset in the transistor 18a, 18b, the output is not affected.

As described above, in accordance with the motor controlling circuit of the invention, since the current gain of the error amplifier is made small when the level of the input signal is small, it is possible to effectively control the effect of the ripple carried on the motor controlling signal. In addition, it is possible to completely eliminate an output when there is no input to the motor controlling circuit.

What is claimed is:

1. An amplifier for outputting a DC motor controlling signal in a motor controlling circuit, comprising:
    an input current regulator for controlling the current flowing thereacross in response to an input signal;
    a current regulator for controlling the current flowing thereacross in response to the amount of the current flowing across said input current regulator;
    amplifying means for amplifying said input signal, said amplifying means being connected to said current regulator; and wherein the current outputting capability of said amplifying means is changed in accordance with the amount of the current flowing across said current regulator so that said current outputting capability is changed in such a manner as to become small when the level of the input signal is small and to become large when the level of the input signal is large.

2. An amplifier for outputting a DC motor controlling signal in a motor controlling circuit according to claim 1, further comprising a differential amplifier, the change of said current outputting capability being effected by changing a gain of said differential amplifier.

3. An amplifier for outputting a DC motor controlling signal in a motor controlling circuit according to claim 2, wherein said differential amplifier comprises a current mirror constituted by a pair of transistors that are connected to a power source and allow an identical current to flow; a pair of transistors which are disposed on the downstream side of said current mirror and whose amounts of current are varied due to a difference in the signal inputted to their respective bases; and a current setting transistor which is disposed on the downstream side of said pair of transistors and is adapted to hold a sum of amounts of current flowing across said pair of transistors at a predetermined value.

4. An amplifier for outputting a DC motor controlling signal in a motor controlling circuit according to claim 3, wherein a current mirror is disposed on the downstream side of said current regulator, the output-side transistor of said current mirror is set as said current setting transistor, and the current flowing across said current setting transistor is varied in correspondence with an amount of current flowing across said current regulator.

* * * * *